(12) United States Patent
Jin

(10) Patent No.: US 10,446,666 B2
(45) Date of Patent: Oct. 15, 2019

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Lan Jin, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 0 days.

(21) Appl. No.: 15/912,145

(22) Filed: Mar. 5, 2018

(65) Prior Publication Data
US 2018/0261684 A1 Sep. 13, 2018

(30) Foreign Application Priority Data

Mar. 7, 2017 (CN) .......................... 2017 1 0131338

(51) Int. Cl.
H01L 29/66 (2006.01)
H01L 21/02 (2006.01)
(Continued)

(52) U.S. Cl.
CPC .... *H01L 29/66636* (2013.01); *H01L 21/0262* (2013.01); *H01L 21/02433* (2013.01); *H01L 21/02532* (2013.01); *H01L 21/02579* (2013.01); *H01L 21/02645* (2013.01); *H01L 21/3065* (2013.01); *H01L 21/76224* (2013.01); *H01L 21/76802* (2013.01); *H01L 21/76877* (2013.01); *H01L 29/0649* (2013.01);
(Continued)

(58) Field of Classification Search
CPC ......... H01L 21/02529; H01L 21/76224; H01L 21/02532; H01L 21/76802; H01L 21/76877; H01L 21/3065; H01L 21/0262; H01L 21/02645; H01L 21/02433; H01L 29/66636; H01L 29/165; H01L 29/7848; H01L 29/0649; H01L 21/02579
See application file for complete search history.

(56) References Cited

U.S. PATENT DOCUMENTS

2012/0056245 A1* 3/2012 Kang .................. H01L 21/0245
257/192

* cited by examiner

*Primary Examiner* — Jasmine J Clark
(74) *Attorney, Agent, or Firm* — Anova Law Group, PLLC

(57) ABSTRACT

A semiconductor structure and a method for fabricating the semiconductor structure are provided. The method includes forming an epitaxial layer in a substrate. The epitaxial layer includes a first region having a first crystal plane and a second region having a second crystal plane, and indices of lattice planes of the first crystal plane and the second crystal plane are different. The method also includes forming a capping structure including one or more capping layers on the first region and the second region. Forming the capping layer includes forming an initial capping layer having different thicknesses on the first region and the second region; and etching the initial capping layer to reduce a thickness difference between the initial capping layer on the first region and the initial capping layer on the second region. Further, the method includes forming an electrode electrically connected to the capping structure.

20 Claims, 7 Drawing Sheets

(51) Int. Cl.
*H01L 21/3065* (2006.01)
*H01L 29/165* (2006.01)
*H01L 21/768* (2006.01)
*H01L 29/78* (2006.01)
*H01L 21/762* (2006.01)
*H01L 29/06* (2006.01)

(52) U.S. Cl.
CPC ........ *H01L 29/165* (2013.01); *H01L 29/7848* (2013.01); *H01L 21/02529* (2013.01)

US 10,446,666 B2

SEMICONDUCTOR STRUCTURE AND FABRICATION METHOD THEREOF

CROSS-REFERENCES TO RELATED APPLICATIONS

This application claims the priority of Chinese patent application No. 201710131338.4, filed on Mar. 7, 2017, the entirety of which is incorporated herein by reference.

FIELD OF THE DISCLOSURE

The present disclosure generally relates to the field of semiconductor manufacturing technology and, more particularly, relates to a semiconductor structure and fabrication method thereof.

BACKGROUND

With the rapid development of semiconductor manufacturing technology, the semiconductor device has been developed toward higher component density and higher integration degree. To improve the integration degree, the density of transistors continues to increase and the spacing therebetween is gradually reduced.

The development of semiconductor device toward high integration degree is often accompanied by a reduction of channel carrier mobility. A conventional solution includes use of strained silicon technologies to improve the channel carrier mobility of the transistor. In the strained silicon technology, a layer of a crystal having a lattice constant different from that of the silicon substrate is epitaxially grown on source and drain regions of the transistor. Moreover, to connect the source and drain regions to external circuits, metal silicide needs to be formed on the layer of the crystal.

However, the performance of conventional semiconductor structure still needs to be improved. The disclosed device structures and methods are directed to solve one or more problems set forth above and other problems.

BRIEF SUMMARY OF THE DISCLOSURE

One aspect of the present disclosure includes a method for fabricating a semiconductor structure. The method includes forming an epitaxial layer in a substrate. The epitaxial layer includes a first region and a second region, the first region of the epitaxial layer has a first crystal plane, the second region of the epitaxial layer has a second crystal plane, and indices of lattice planes of the first crystal plane and the second crystal plane are different. The method also includes forming a capping structure on the first region and the second region of the epitaxial layer. The capping structure includes one or more capping layers. Forming the capping layer includes forming an initial capping layer on the first region and the second region of the epitaxial layer. A thickness of the initial capping layer on the first region is different from a thickness of the initial capping layer on the second region. Forming the capping layer also includes etching the initial capping layer to reduce a thickness difference between the initial capping layer on the first region and the initial capping layer on the second region. Further, the method includes forming an electrode electrically connected to the capping structure.

Another aspect of the present disclosure includes a semiconductor structure. The semiconductor structure includes an epitaxial layer in a substrate. The epitaxial layer includes a first region and a second region, the first region of the epitaxial layer has a first crystal plane, the second region of the epitaxial layer has a second crystal plane, and indices of lattice planes of the first crystal plane and the second crystal plane are different. The semiconductor structure also includes a capping structure on the first region and the second region of the epitaxial layer. The capping structure includes one or more capping layers. Forming the capping layer includes forming an initial capping layer on the first region and the second region of the epitaxial layer. A thickness of the initial capping layer on the first region is different from a thickness of the initial capping layer on the second region. Forming the capping layer also includes etching the initial capping layer to reduce a thickness difference between the initial capping layer on the first region and the initial capping layer on the second region. Further, the semiconductor structure includes an electrode electrically connected to the capping structure.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
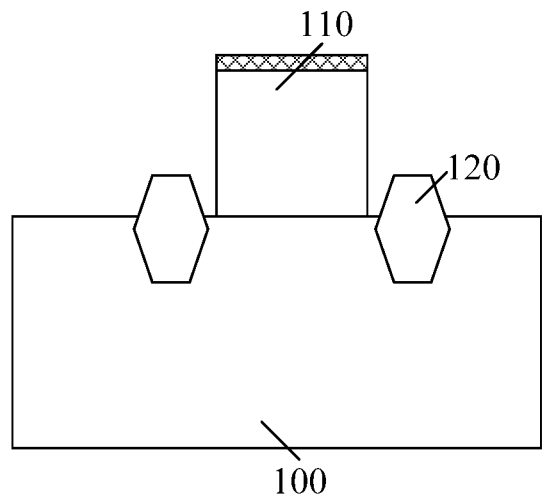
FIGS. 1-3 illustrate semiconductor structures corresponding to certain stages for forming a semiconductor structure.
Figure 2:
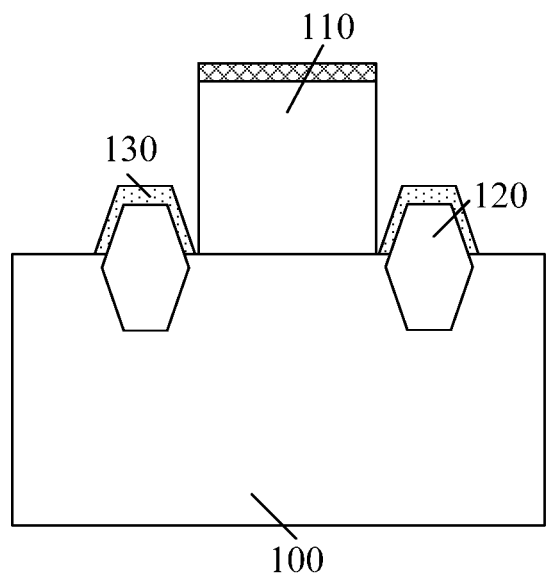
Figure 3:
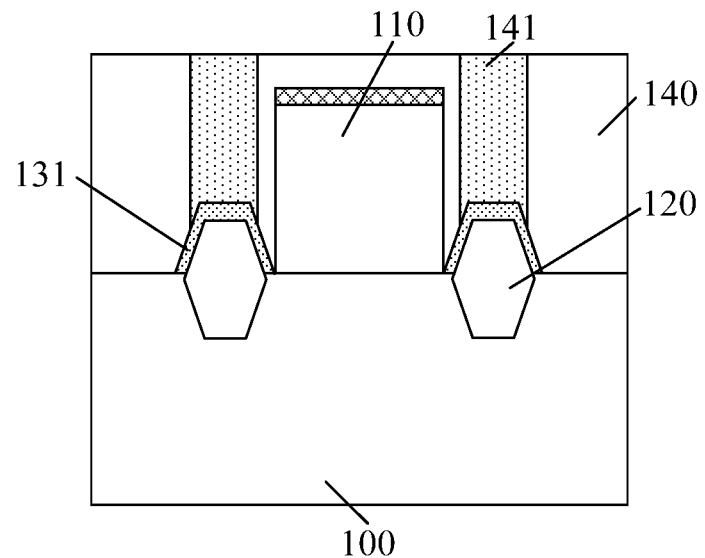

FIGS. 1-3 illustrate semiconductor structures corresponding to certain stages for forming a semiconductor structure. Referring to FIG. 1, a substrate 100 is provided, and a gate structure 110 is formed on the substrate 100. An epitaxial layer 120 is formed in the substrate 100 on the both sides of the gate structure.

Referring to FIG. 2, a capping structure 130 is formed on the epitaxial layer 120 using an epitaxial growth process. Referring to FIG. 3, a metal layer is formed on the capping structure 130 (illustrated in FIG. 2). The metal layer reacts with the capping structure 130 to form a metallized compound layer 131. A dielectric layer 140 is formed to cover the metallized compound layer 131 and the gate structure 110. A contact hole is formed in the dielectric layer 140, and exposes the epitaxial layer 120. An electrode 141 is formed in the contact hole.

The epitaxial layer 120 is made of silicon germanium. The substrate 100 exposes a (100) crystal plane and a (111) crystal plane of the epitaxial layer 120. The capping structure 130 is made of monocrystalline silicon. When forming the capping structure 130, the epitaxial layer 120 is used as a seed layer to grow the capping structure 130. A growth rate of the capping structure 130 along a direction perpendicular to the (100) crystal plane is larger than a growth rate thereof along a direction perpendicular to the (111) crystal plane. Therefore, a thickness of the capping structure 130 on the (100) crystal plane of the epitaxial layer 120 is larger than a thickness of the capping structure 130 on the (111) crystal plane of the epitaxial layer 120, such that the thickness of the capping structure is non-uniform. If the thickness of the capping structure 130 is small, the thickness of the capping structure 130 on the (111) crystal plane of the epitaxial layer 120 is too small. As a result, holes are easily formed when forming the contact hole. If the thickness of the capping structure 130 is large, the thickness of the capping structure 130 on the (100) crystal plane of the epitaxial layer 120 is too large. As a result, a resistance of the capping structure 130 between the electrode 141 and the epitaxial layer 120 is too large, affecting the performance of the semiconductor structure.

Figure 10:
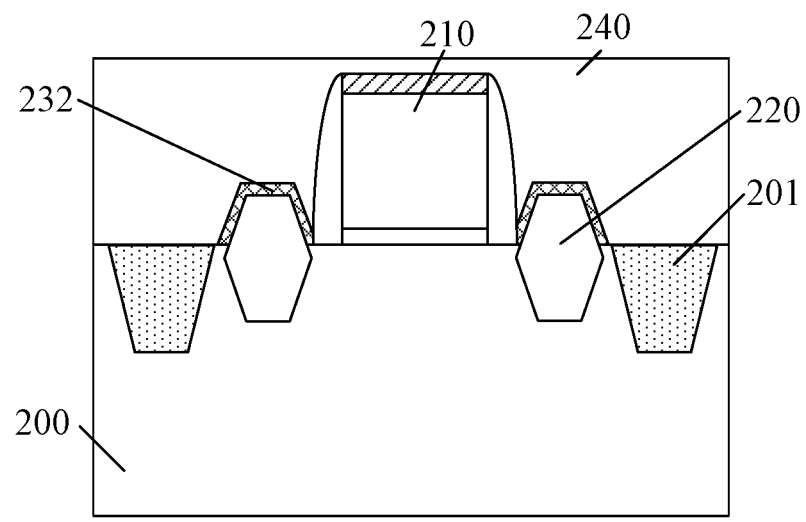
Figure 11:
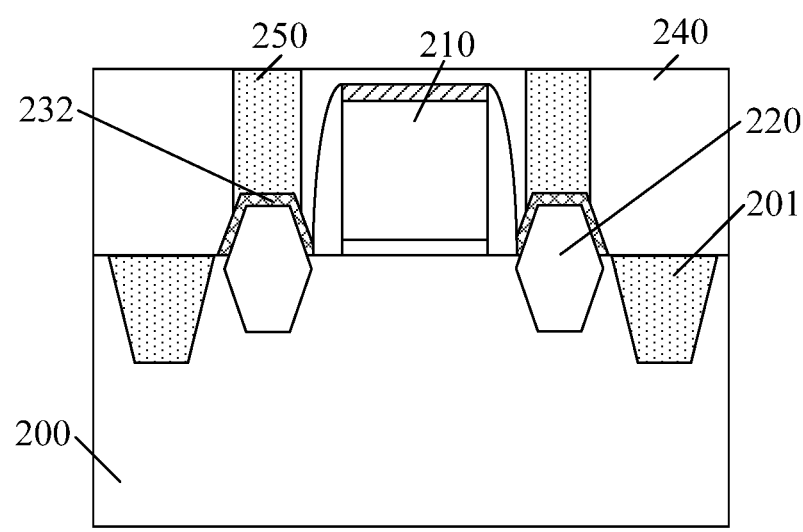
Figure 12:
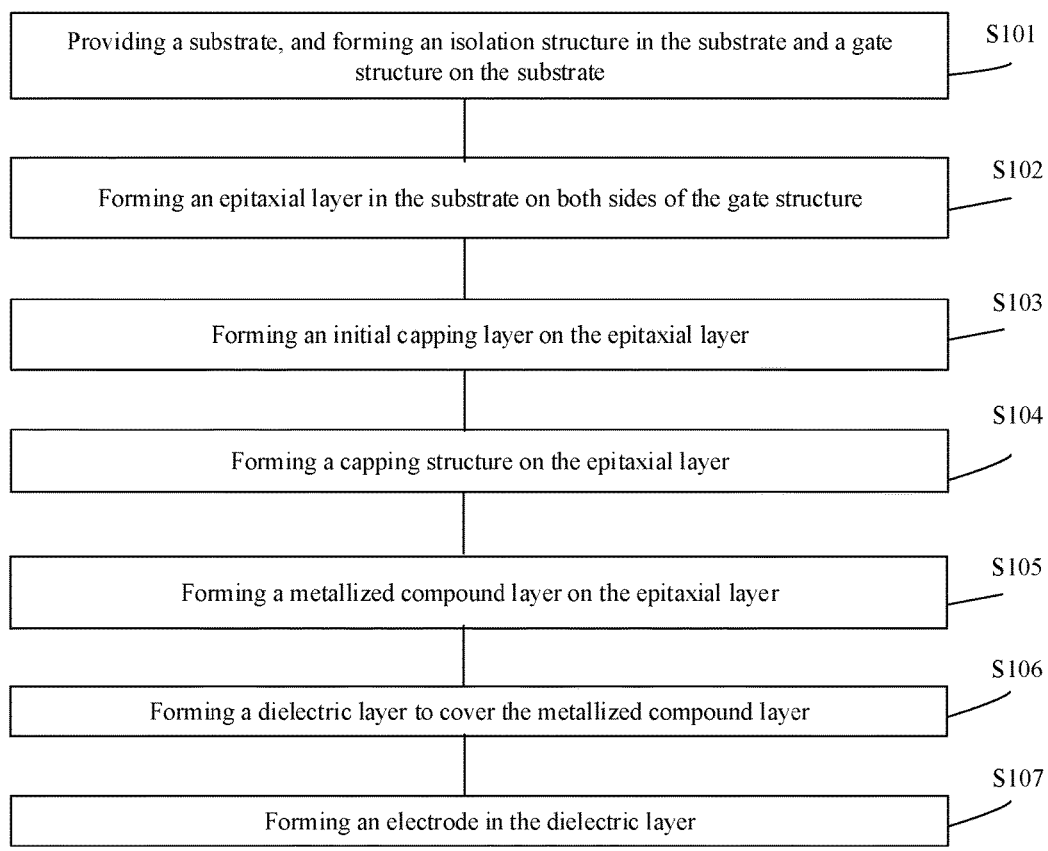
FIG. 12 illustrates an exemplary fabrication method for forming a semiconductor structure consistent with various disclosed embodiments of the present disclosure.

The present disclosure provides a semiconductor structure and fabrication method thereof. FIG. 12 illustrates an exemplary fabrication method for forming a semiconductor structure consistent with various disclosed embodiments of the present disclosure; and FIGS. 4-11 illustrate semiconductor structures corresponding to certain stages of the exemplary fabrication method.

Figure 4:
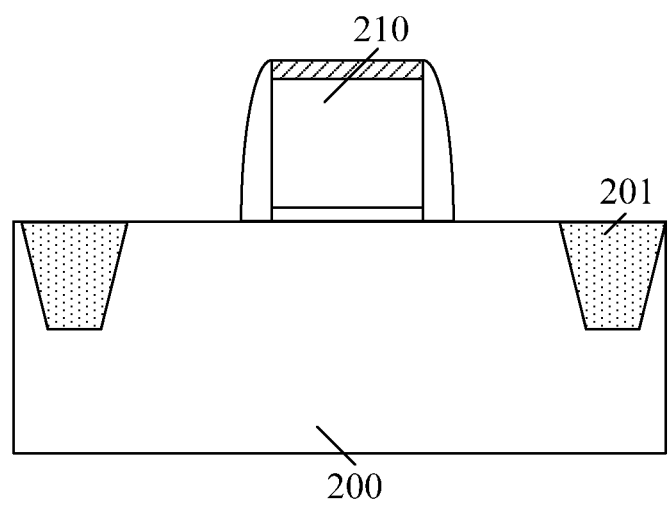
FIGS. 4-11 illustrate semiconductor structures corresponding to certain stages for forming an exemplary semiconductor structure consistent with various disclosed embodiments of the present disclosure.

As illustrated in FIG. 12, at the beginning of the fabrication method, a substrate with certain structures may be provided (S101). FIG. 4 illustrates a corresponding semiconductor structure.

Referring to FIG. 4, a substrate 200 may be provided. In one embodiment, the substrate 200 may be a planar substrate. In another embodiment, the substrate may include a base substrate and a fin on the base substrate. In one embodiment, the substrate 200 may be a silicon substrate. In another embodiment, the substrate may be a germanium substrate, a silicon germanium substrate, a silicon on insulator (SOI) substrate, a germanium on insulator (GOI) substrate, or a silicon germanium on insulator (SGOI) substrate, etc.

In one embodiment, the substrate 200 may be used to form a PMOS transistor. In another embodiment, the substrate 200 may be used to form a resistor, a diode, a transistor, or an NMOS transistor, etc.

A (100) crystal plane of silicon has low surface state density, few surface dangling bonds, and high surface carrier mobility, which may facilitate controlling a threshold voltage of on-off state of the formed transistor. Therefore, in one embodiment, an index of lattice plane or a Miller index of the surface of the substrate 200 may be (100).

In one embodiment, an isolation structure 201 may be formed in the substrate 200. The isolation structure 201 may isolate different semiconductor devices from each other, and/or may be used as a mask for etching the substrate 200. In one embodiment, the isolation structure 201 may be made of silicon oxide. In another embodiment, the isolation structure may be made of silicon oxynitride.

In one embodiment, a gate structure 210 may be formed on the substrate 200. In one embodiment, the gate structure 210 may include a gate dielectric layer on the surface of the substrate 200, a gate electrode on the gate dielectric layer, a mask layer on the gate electrode, and a sidewall spacer on the side surfaces of the gate dielectric layer, the gate electrode, and the mask layer.

In one embodiment, the gate dielectric layer may be made of silicon oxide. In one embodiment, the gate electrode may be made of polysilicon. In another embodiment, the gate electrode may be made of poly-germanium. In one embodiment, the mask layer may be made of silicon nitride, silicon oxynitride, or silicon oxide, etc. In one embodiment, the sidewall spacer may be made of silicon nitride, or silicon oxynitride, etc.

Figure 5:
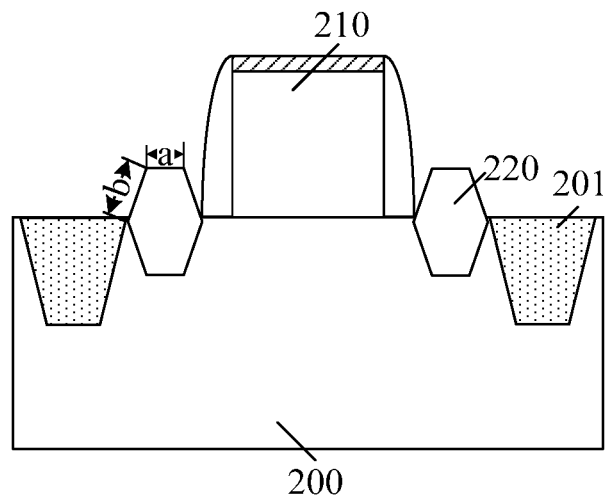

Returning to FIG. 12, after providing the substrate, an epitaxial layer may be formed (S102). FIG. 5 illustrates a corresponding semiconductor structure.

Referring to FIG. 5, an epitaxial layer 220 may be formed in the substrate 200. The epitaxial layer 220 may include a first region 'a' and a second region 'b'. The first region 'a' of the epitaxial layer 220 may have a first crystal plane, and the second region 'b' of the epitaxial layer 220 may have a second crystal plane. Miller indices of the first crystal plane and the second crystal plane may be different.

In one embodiment, the epitaxial layer 220 may be used to form a source and drain doped layer of a PMOS transistor. In one embodiment, forming the epitaxial layer 220 may include forming a trench in the substrate 200 on both sides of the gate structure 210, and forming the epitaxial layer 200 in the trench. In one embodiment, a process for forming the trench may include a dry etching process and/or a wet etching process.

In one embodiment, the epitaxial layer 220 may be made of silicon germanium. For example, a lattice constant of silicon germanium is greater than a lattice constant of the substrate 200, thus a compressive stress may be provided to a channel region under the gate structure 210. A channel carrier mobility of the formed PMOS transistor may increase. In another embodiment, the epitaxial layer may be used to form an NMOS transistor, and the epitaxial layer may be made of silicon carbon to provide tensile stress for the channel region under the gate structure 210.

In one embodiment, the epitaxial layer 220 may be formed using an epitaxial growth process. The epitaxial layer 220 may be doped with ions by performing an in-situ doping process on the epitaxial layer 220 when forming the epitaxial layer 220.

In one embodiment, the epitaxial layer 220 may be used to form a PMOS transistor, and the doped ions may be P-type ions, such as B ions, or $BF^{2-}$ ions, etc. In another embodiment, the epitaxial layer 220 may be used to form an NMOS transistor, and the doped ions may be N-type ions, such as P ions, or As ions, etc.

A top surface of the epitaxial layer 220 may be above the surface of the substrate 200, such that the epitaxial layer 220 may provide sufficient compressive stress for the channel region of the transistor, for example.

A sidewall surface of the epitaxial layer 220 protruding over the surface of the substrate 200 may be a (111) crystal plane. When forming the epitaxial layer 220 using an epitaxial growth process, a growth rate of the epitaxial layer 220 along a direction perpendicular to the (100) crystal plane may be larger than a growth rate of the epitaxial layer 220 along a direction perpendicular to the (111) crystal plane. Since the Miller index of the surface of the substrate 200 is (100), a surface of the epitaxial layer 220 parallel to the surface of the substrate 200 may be a (100) crystal plane. Since the growth rate of the epitaxial layer 220 along the direction perpendicular to the (100) crystal plane is larger, the (100) crystal plane of the epitaxial layer 220 may gradually decrease, and the (111) crystal plane thereof may gradually increase during the epitaxial growth process.

In one embodiment, the substrate 200 may expose the (100) crystal plane and the (111) crystal plane of the epitaxial layer 220. The (100) crystal plane of the epitaxial layer 220 may be the first crystal plane, and the substrate 200 may expose the first crystal plane. The (111) crystal plane of the epitaxial layer 220 may be the second crystal plane, and the substrate 200 may expose the second crystal plane.

In one embodiment, a seed layer (not illustrated) may be formed on a portion of the epitaxial layer 220 that are above the surface of the substrate 200. The seed layer may serve as a seed crystal for subsequently forming a capping structure. The seed layer may protect the epitaxial layer 220 when subsequently removing a metal layer. In one embodiment, the seed layer may be formed using an epitaxial growth process. In one embodiment, the seed layer may be made of monocrystalline silicon. In another embodiment, the seed layer may be made of monocrystalline germanium.

In one embodiment, when forming the seed layer, a growth rate of the seed layer along a direction perpendicular to the first crystal plane may be larger than a growth rate of the seed layer along a direction perpendicular to the second crystal plane. Therefore, a thickness of the seed layer on the first crystal plane may be larger than a thickness of the seed layer on the second crystal plane.

In one embodiment, since the thickness of the seed layer is small, a thickness difference between the seed layer on the first crystal plane and the seed layer on the second crystal plane may be small. In one embodiment, the thickness of the seed layer may be in a range of approximately 0 nm-5 nm.

In another embodiment, the thickness of the seed layer may be large. Forming the seed layer may include: forming an initial seed layer on the epitaxial layer; and etching the initial seed layer to reduce a thickness difference between the initial seed layer on the first crystal plane and the initial seed layer on the second crystal plane to form the seed layer.

In certain embodiments, the seed layer may include a plurality of layers. The plurality of layers of the seed layer may be laminated along the direction perpendicular to the surface of the substrate.

A capping structure may be subsequently formed over the epitaxial layer 220. The capping structure may include a singer layer or a plurality of laminated layers of the capping layer.

Figure 6:
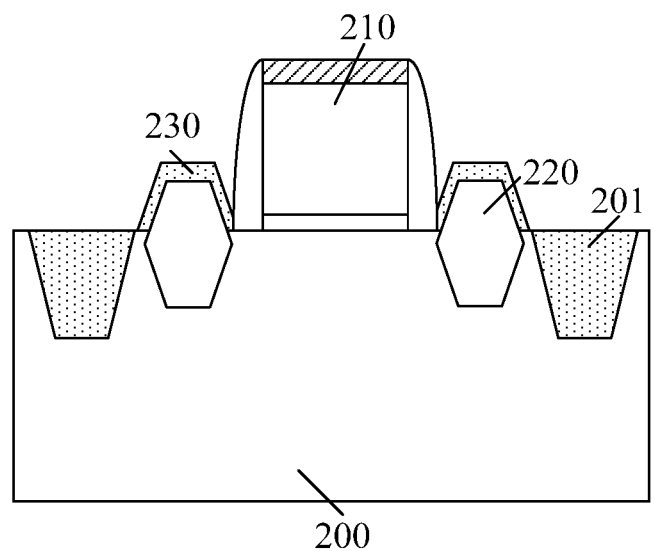

Returning to FIG. 12, after forming the epitaxial layer, an initial capping layer may be formed (S103). FIG. 6 illustrates a corresponding semiconductor structure.

Referring to FIG. 6, an initial capping layer 230 may be formed on the epitaxial layer 220. A thickness of the initial capping layer 230 on the first region 'a' (illustrated in FIG. 5) may be different from a thickness of the initial capping layer 230 on the second region 'b' (illustrated in FIG. 5).

In one embodiment, the initial capping layer 230 may be used to subsequently form a capping layer. In one embodiment, the initial capping layer 230 may be formed using an epitaxial growth process. In one embodiment, the initial capping layer 230 may be made of monocrystalline silicon. In another embodiment, the initial capping layer may be made of monocrystalline germanium. In one embodiment, the initial capping layer 230 may be formed on the surface of the seed layer.

Figure 7:
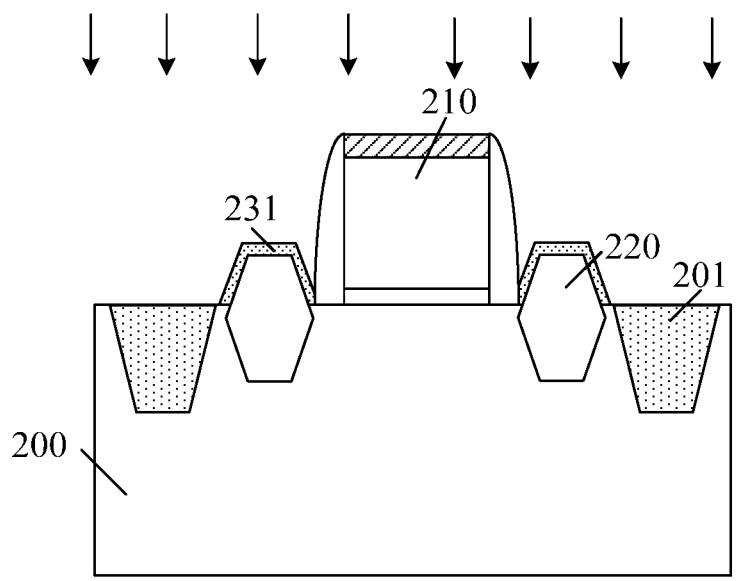
Figure 8:
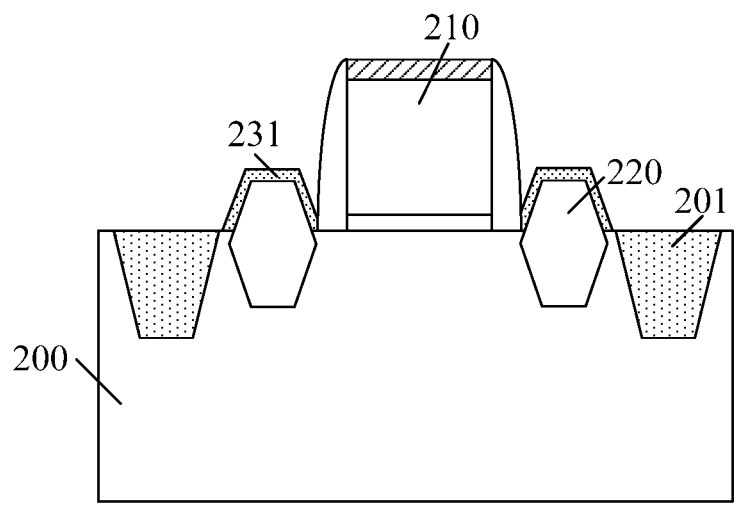

Returning to FIG. 12, after forming the initial capping layer, a capping structure may be formed (S104). FIGS. 7-8 illustrate a corresponding semiconductor structure.

Referring to the FIGS. 7-8, a capping layer 231 may be formed by etching the initial capping layer 230 (illustrated in FIG. 6) to reduce a thickness difference between the initial capping layer 230 on the first region 'a' (illustrated in the FIG. 5) and the initial capping layer 230 on the second region 'b' (illustrated in the FIG. 5).

The thickness difference between the initial capping layer 230 on the first region 'a' and the initial capping layer 230 on the second region 'b' may be reduced by etching the initial capping layer 230, such that the thickness of the capping layer 231 may be uniform. Therefore, a thickness of a subsequently formed capping structure may be uniform, and a resistance of the capping structure between a subsequently formed electrode and the epitaxial layer 220 may be uniform, such that the performance of the formed semiconductor structure may be improved.

In one embodiment, the capping layer 231 may form the capping structure 231. In another embodiment, the capping structure 231 may include a single layer of the capping layer. In certain embodiments, the capping structure 231 may include a plurality of layers of the capping layer.

In one embodiment, the initial capping layer 230 may be made of silicon. Since atomic density of the (111) crystal plane of silicon is larger than atomic density of the (100) crystal plane thereof, it may be difficult to etch the (111) crystal plane of silicon. An etching rate of the (111) crystal plane of silicon may be low. In other words, an etching rate of the initial capping layer 230 on the first region 'a' may be larger than an etching rate of the initial capping layer 230 on the second region 'b'. Since the thickness of the initial capping layer 230 on the first region 'a' is larger than the thickness of the initial capping layer 230 on the second region 'b', the uniformity of the thickness of the capping layer 231 may increase by etching the initial capping layer 230. Therefore, the performance of the formed semiconductor structure may be improved.

In one embodiment, the initial capping layer 230 may be etched using a dry etching process. In another embodiment, the initial capping layer may be etched using a wet etching process.

In on embodiment, etching gases for etching the initial capping layer 230 may include one or more of HCl, $Cl_2$, $F_2$, and HF. In another embodiment, the etching gases for etching the initial capping layer may also include one or more of germane and dichlorosilane.

In one embodiment, process parameters for etching the initial capping layer 230 may include an etching temperature in a range of approximately 500° C.-1000° C., and a gas pressure in a range of approximately 0 Torr-600 Torr.

In one embodiment, the thickness of the capping layer 231 may be in a range of approximately 0 nm-25 nm. In one embodiment, the capping structure may include a single layer of the capping layer 231. In another embodiment, the capping structure may include a plurality of layers of the capping layer. The plurality of layers of the capping layer may be laminated along the direction perpendicular to the surface of the substrate. Forming the capping structure may include repeatedly forming additional capping layer(s).

Figure 9:
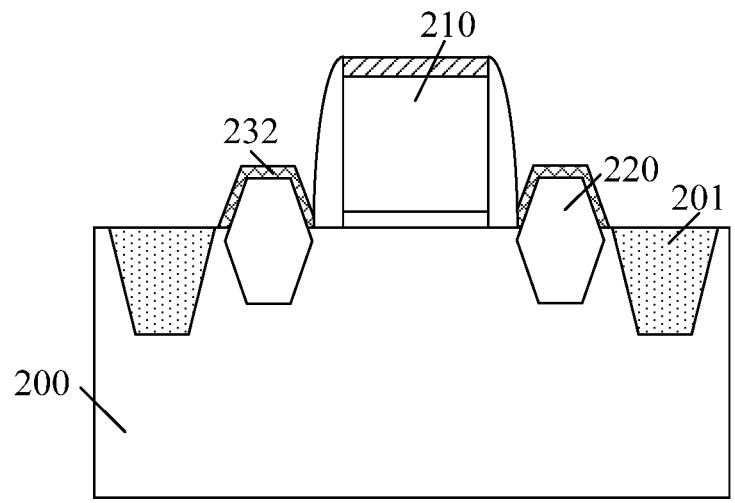

Returning to FIG. 12, after forming the capping structure, a metallized compound layer may be formed (S105). FIG. 9 illustrates a corresponding semiconductor structure.

Referring to FIG. 9, a metallized compound layer 232 may be formed by forming a metal layer on the capping structure. The metal layer may react with the capping structure 231 to form the metallized compound layer 232.

The metallized compound layer 232 may reduce a barrier between a subsequently formed electrode and the epitaxial layer 220, such that a contact resistance between the electrode and the epitaxial layer 220 may be reduced.

In one embodiment, forming the metallized compound layer 232 may include forming a metal layer on the surface of isolation structure 201, the surface of the gate structure 210, and the surface of capping structure. The metal layer may react with the capping structure to form the metallized compound layer 232. Forming the metallized compound layer 232 may also include removing the metal layer on the surface of the isolation structure 201 and the surface of the gate structure 210 after forming the metalized compound layer 232.

In one embodiment, the metal layer may be removed using a wet etching process. In one embodiment, the metal layer may be made of nickel. The metalized compound layer 232 may be made of nickel silicon.

An electrode electrically connected to the capping structure may be subsequently formed. In one embodiment, the electrode may be in contact with the metallized compound layer 232.

Returning to FIG. 12, after forming the metallized compound layer, a dielectric layer may be formed (S106). FIG. 10 illustrates a corresponding semiconductor structure.

Referring to FIG. 10, a dielectric layer 240 may be formed on the substrate 200 to cover the metallized compound layer 232. The dielectric layer 240 may isolate subsequently formed electrodes with each other.

In one embodiment, the dielectric layer 240 may be made of silicon oxide. In another embodiment, the dielectric layer may be made of silicon nitride, or silicon oxynitride, etc. In one embodiment, the dielectric layer 240 may be formed using a chemical vapor deposition process.

Returning to FIG. 12, after forming the dielectric layer, an electrode may be formed (S107). FIG. 11 illustrates a corresponding semiconductor structure.

Referring to FIG. 11, an electrode 250 may be formed in a contact hole. The contact hole may be formed in the dielectric layer 240, and may expose the metallized compound layer 232. The contract hole may accommodate the electrode and the electrode may fill up the contact hole. In one embodiment, the contact hole may be formed using a dry etching process.

Since the thickness of the capping structure 231 (illustrated in the FIG. 8) is uniform, the thickness of the metallized compound layer 232 may be uniform. Therefore, the thickness of the metallized compound layer 232 on the first region may be same as the thickness of the metallized compound layer 232 on the second region. The thickness of the metallized compound layer 232 on the second region may not be too small while ensuring that the resistance of the metallized compound layer 232 on the first region is not too large. Therefore, holes may not be easily formed in the metallized compound layer 232 when forming the contact hole, such that the performance of the formed semiconductor structure may be improved. At the same time, the thickness of the metallized compound layer 232 on the first region may not be too large while ensuring that the metallized compound layer 232 on the second region has a certain thickness, such that the resistance of the metallized compound layer 232 may increase.

Referring to FIG. 11, the electrode 250 may be formed in the contact hole. The electrode 250 may electrically connect the epitaxial layer 220 to external circuits. In one embodiment, the electrode 250 may be made of tungsten. In another embodiment, the electrode may be made of copper, or any suitable metal(s).

In one embodiment, the electrode 250 may be formed using a chemical vapor deposition process. In another embodiment, the electrode 250 may be formed using a physical vapor deposition process, or an electrochemical coating process, etc.

In one embodiment, the capping structure 231 is used to form the metallized compound layer 232 as an example. In another embodiment, the capping structure 231 may be used as a seed layer between the metallized compound layer and the epitaxial layer. In one embodiment, before forming the electrode, a reaction layer may be formed on the capping structure, and a metal layer may be formed on the reaction layer. The metal layer may react with the reaction layer to form the metallized compound layer.

Accordingly, in the disclosed method for forming the semiconductor structure, since the Miller indices of the first crystal plane and the second crystal plane are different, the thickness of the initial capping layer on the first region may be different from the thickness of the initial capping layer on the second region. The thickness difference between the initial capping layer on the first region and the initial capping layer on the second region may be reduced by etching the initial capping layer. Thus, the thickness of the initial capping layer may be uniform, and the thickness of the capping structure may be uniform. The resistance of the capping structure between the electrode and the epitaxial layer may be uniform. Therefore, the performance of the semiconductor structure in the present disclosure may be improved.

The present disclosure also provides a semiconductor structure. Referring to FIG. 11, the semiconductor structure may include a substrate 200, an isolation structure 201 in the substrate 200, and a gate structure 210 on the substrate 200. In one embodiment, the gate structure 210 may include a gate dielectric layer on the surface of the substrate 200, a gate electrode on the gate dielectric layer, a mask layer on the gate electrode, and a sidewall spacer on the side surfaces of the gate dielectric layer, the gate electrode, and the mask layer. The semiconductor structure may also include an epitaxial layer 220 in the substrate 200 on both sides of the gate structure. The epitaxial layer 220 may include a first region 'a' and a second region 'b'. The first region 'a' of the epitaxial layer 220 may have a first crystal plane, and the second region 'b' of the epitaxial layer 220 may have a second crystal plane. The first crystal plane may be a (100) crystal plane of the epitaxial layer 220, and the second crystal plane may be a (111) crystal plane of the epitaxial layer 220. In addition, the semiconductor structure may include a metallized compound layer 232 on the epitaxial layer 220. A thickness of the metallized compound layer 232 on the first region may be the same as a thickness of the metallized compound layer 232 on the second region. Moreover, the semiconductor structure may include a dielectric layer 240 on the substrate 200 and covering the metallized compound layer 232. Further, the semiconductor structure may include an electrode 250. The electrode 250 may electrically connect the epitaxial layer 220 to external circuits.

The metallized compound layer 232 may be formed by the following. An initial capping layer may be formed on the epitaxial layer 220. A thickness of the initial capping layer on the first region may be larger than a thickness of the initial capping layer on the second region. An etching rate of the initial capping layer on the first region may be larger than an etching rate of the initial capping layer on the second region. A capping layer may be formed by etching the initial capping layer to reduce the thickness difference between the initial capping layer on the first region and the initial capping layer on the second region. Since the thickness of the initial capping layer on the first region is larger than the thickness of the initial capping layer on the second region, the uniformity of the thickness of the capping layer may increase by etching the initial capping layer.

In one embodiment, the capping layer may form a capping structure. In another embodiment, the capping structure may include a single layer of the capping layer. In certain embodiments, the capping structure may include a plurality of layers of the capping layer. The metallized compound layer 232 may be formed by forming a metal layer on the capping structure. The metal layer may react with the capping structure to form the metallized compound layer 232.

Since the thickness of the capping structure is uniform, the thickness of the metallized compound layer 232 may be uniform. Therefore, the thickness of the metallized compound layer 232 on the first region may be the same as the thickness of the metallized compound layer 232 on the second region, such that a resistance of the metallized compound layer 232 between the electrode and the epitaxial layer may be uniform. Therefore, the performance of the semiconductor structure in the present disclosure may be improved.

In one embodiment, the initial capping layer may be a conformal silicon layer, and may be fabricated by a reduced pressure chemical vapor deposition process (RPCVD). In one embodiment, process parameters of the RPCVD may include the following. A temperature may be in a range of approximately 500° C.-1000° C., a pressure may be in a range of approximately 0 Torr-50 Torr, and precursor may include $SiH_4$, dichlorosilane, $Si_2H_6$ and $B_2H_6$, etc. The capping layer may be formed by etching the initial capping layer. Etching gases for etching the initial capping layer may include one or more of HCl, $Cl_2$, $F_2$, and HF. In another embodiment, the etching gases for etching the initial capping layer may also include one or more of germane and dichlorosilane. Forming the capping structure may include repeatedly forming additional capping layer(s). In one embodiment, Nicole may be deposited on the capping structure as a silicide layer.

Accordingly, in the disclosed method for forming the semiconductor structure, since the Miller indices of the first crystal plane and the second crystal plane are different, the thickness of the initial capping layer on the first region may be different from the thickness of the initial capping layer on the second region. The thickness difference between the initial capping layer on the first region and the initial capping layer on the second region may be reduced by etching the initial capping layer. Thus, the thickness of the initial capping layer may be uniform, and the thickness of the capping structure may be uniform. The resistance of the capping structure between the electrode and the epitaxial layer may be uniform. Therefore, the performance of the semiconductor structure in the present disclosure may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those skilled in the art. Any equivalent or modification thereof, without departing from the spirit and principle of the present disclosure, falls within the true scope of the present disclosure.

What is claimed is:

1. A method for forming a semiconductor structure, comprising:
   forming an epitaxial layer in a substrate, wherein the epitaxial layer includes a first surface and a second surface, the first surface of the epitaxial layer is parallel to a top surface of the substrate, the second surface of the epitaxial layer is inclined to the top surface of the substrate, and a first growth rate of the epitaxial layer in a direction perpendicular to the first surface is larger than a second growth rate of the epitaxial layer in a direction perpendicular to the second surface;
   forming a capping structure on the first surface and the second surface of the epitaxial layer, wherein the capping structure includes one or more capping layers, and the capping layer is formed by:
   forming an initial capping layer on the first surface and the second surface of the epitaxial layer, wherein a thickness of the initial capping layer on the first surface is different from a thickness of the initial capping layer on the second surface, and
   etching the initial capping layer to reduce a thickness difference between the initial capping layer on the first surface and the initial capping layer on the second surface; and
   forming an electrode electrically connected to the capping structure.

2. The method according to claim 1, wherein:
   the epitaxial layer is made of one of silicon germanium, silicon carbide, germanium, and silicon.

3. The method according to claim 1, wherein:
   the capping layer is made of one of monocrystalline silicon, monocrystalline germanium, silicon phosphorus and silicon boron.

4. The method according to claim 1, wherein:
   etching the initial capping layer includes one of a dry etching process and a wet etching process, and
   the capping layer has a uniform thickness after etching the initial capping layer.

5. The method according to claim 4, wherein etching gases of the dry etching process for etching the initial capping layer include:
   one or more of HCl, $Cl_2$, $F_2$, and HF.

6. The method according to claim 5, wherein the etching gases of the dry etching process for etching the initial capping layer further include:
   one or more of germane and dichlorosilane.

7. The method according to claim 6, wherein process parameters for etching the initial capping layer include:
   an etching temperature in a range of approximately 500° C.-1000° C.; and
   a gas pressure in a range of approximately 0 Torr-600 Torr.

8. The method according to claim 1, wherein:
   a thickness of the capping layer is in a range of approximately 0 nm-25 nm.

9. The method according to claim 1, before forming the initial capping layer, further including:
   forming a seed layer on the epitaxial layer using an epitaxial growth process.

10. The method according to claim 9, wherein:
    the seed layer is made of one of monocrystalline silicon and monocrystalline germanium; and
    a thickness of the seed layer is in a range of approximately 0 nm-5 nm.

11. The method according to claim 1, wherein forming the initial capping layer includes:
    an epitaxial growth process, wherein the epitaxial growth process includes a reduced pressure chemical vapor deposition.

12. The method according to claim 11, wherein process parameters of the reduced pressure chemical vapor deposition include:
    a temperature in a range of approximately 500° C.-1000° C.,
    a pressure in a range of approximately 0 Torr-50 Torr, and precursor including $SiH_4$, dichlorosilane, $Si_2H_6$ and $B_2H_6$.

13. The method according to claim 1, wherein:
the capping structure includes the plurality of layers of the capping layer, laminated along a direction perpendicular to a surface of the substrate, wherein the capping structure is formed by:
repeatedly forming another capping layer over one capping layer.

14. The method according to claim 1, wherein:
a top surface of the epitaxial layer is above a surface of the substrate.

15. The method according to claim 1, further including:
forming a metal layer on the capping structure, wherein the metal layer reacts with the capping structure to form a metallized compound layer.

16. The method according to claim 15, wherein forming the electrode includes:
forming a dielectric layer on the substrate to cover the metallized compound layer;
forming a contact hole in the dielectric layer to expose the metallized compound layer; and
forming the electrode in the contact hole.

17. The method according to claim 1, before forming the epitaxial layer, further including:
forming a gate structure on the substrate, wherein the epitaxial layer is formed in the substrate on both sides of the gate structure.

18. The method according to claim 1, before forming the electrode, further including:
forming a reaction layer on the capping structure; and
forming a metal layer on the reaction layer, wherein the metal layer reacts with the reaction layer to form a metallized compound layer.

19. A semiconductor structure, comprising:
an epitaxial layer in a substrate, wherein the epitaxial layer includes a first surface and a second surface, the first surface of the epitaxial layer is parallel to a top surface of the substrate, the second surface of the epitaxial layer is inclined to the top surface of the substrate, and a first growth rate of the epitaxial layer in a direction perpendicular to the first surface is larger than a second growth rate of the epitaxial layer in a direction perpendicular to the second surface;
a capping structure, on the first surface and the second surface of the epitaxial layer, wherein the capping structure includes one or more capping layers, and the capping layer is formed by:
forming an initial capping layer on the first surface and the second surface of the epitaxial layer, wherein a thickness of the initial capping layer on the first surface is different from a thickness of the initial capping layer on the second surface, and
etching the initial capping layer to reduce a thickness difference between the initial capping layer on the first surface and the initial capping layer on the second surface; and
an electrode, electrically connected to the capping structure.

20. The semiconductor structure according to claim 19, further including:
a gate structure on the substrate, wherein the epitaxial layer is formed in the substrate on both sides of the gate structure;
a metallized compound layer, formed by a reaction of a metal layer on the capping structure with the capping structure; and
a dielectric layer, having the electrode passing therethrough.

* * * * *